(12) United States Patent
Thomas et al.

(10) Patent No.: US 11,643,719 B2
(45) Date of Patent: May 9, 2023

(54) METHOD OF MAKING GRAPHENE LAYER STRUCTURES

(71) Applicant: Paragraf Limited, Somersham (GB)

(72) Inventors: Simon Thomas, Somersham (GB); Ivor Guiney, Somersham (GB)

(73) Assignee: Paragraf Limited, Somersham (GB)

( * ) Notice: Subject to any disclaimer, the term of this patent is extended or adjusted under 35 U.S.C. 154(b) by 0 days.

(21) Appl. No.: 16/961,305

(22) PCT Filed: Jan. 10, 2019

(86) PCT No.: PCT/GB2019/050062
§ 371 (c)(1),
(2) Date: Jul. 10, 2020

(87) PCT Pub. No.: WO2019/138231
PCT Pub. Date: Jul. 18, 2019

(65) Prior Publication Data
US 2021/0079521 A1    Mar. 18, 2021

(30) Foreign Application Priority Data

Jan. 11, 2018 (GB) ................................. 1800451

(51) Int. Cl.
*C23C 16/26* (2006.01)
*C23C 16/455* (2006.01)
(Continued)

(52) U.S. Cl.
CPC ............ *C23C 16/26* (2013.01); *C23C 16/455* (2013.01); *C30B 25/10* (2013.01); *C30B 25/18* (2013.01); *C30B 29/02* (2013.01)

(58) Field of Classification Search
None
See application file for complete search history.

(56) References Cited

U.S. PATENT DOCUMENTS

2004/0028810 A1    2/2004  Grant et al.
2004/0200412 A1   10/2004  Frijlink
(Continued)

FOREIGN PATENT DOCUMENTS

CN    204151456 U    2/2015
CN    104477882 A    4/2015

OTHER PUBLICATIONS

Ito (ACS Nano 2014, 8, 4, 3337-3346 Publication Date:Mar. 18, 2014) (Year: 2014).*
(Continued)

*Primary Examiner* — Joel G Horning
(74) *Attorney, Agent, or Firm* — Stinson LLP

(57) ABSTRACT

A method for the production of a graphene layer structure, the method comprising providing a substrate on a heated susceptor in a reaction chamber, the chamber having a plurality of cooled inlets arranged so that, in use, the inlets are distributed across the substrate and have a constant separation from the substrate, rotating the heated susceptor at a rotation rate of at least 300 rpm, supplying a flow comprising a precursor compound through the inlets and into the reaction chamber to thereby decompose the precursor compound and form graphene on the substrate, wherein the inlets are cooled to less than 100° C., preferably 50 to 60° C., and the susceptor is heated to a temperature of at least 50° C. in excess of a decomposition temperature of the precursor, wherein the constant separation is at least 12 cm and preferably from 12 to 20 cm.

20 Claims, 1 Drawing Sheet

(51) Int. Cl.
    *C30B 25/10*     (2006.01)
    *C30B 25/18*     (2006.01)
    *C30B 29/02*     (2006.01)

(56) References Cited

U.S. PATENT DOCUMENTS

| | | |
|---|---|---|
| 2014/0124788 A1 | 5/2014 | Kraus et al. |
| 2015/0279506 A1 | 10/2015 | Wolfrum et al. |
| 2017/0253967 A1* | 9/2017 | Mitrovic ........... C23C 16/45519 |
| 2018/0308684 A1 | 10/2018 | Thomas |

OTHER PUBLICATIONS

Hu (Carbon 50 (2012) 57-65) (Year: 2012).*
International Search Report and Written Opinion, PCT/GB2019/050062, dated Apr. 12, 2019, 13 pages.

\* cited by examiner

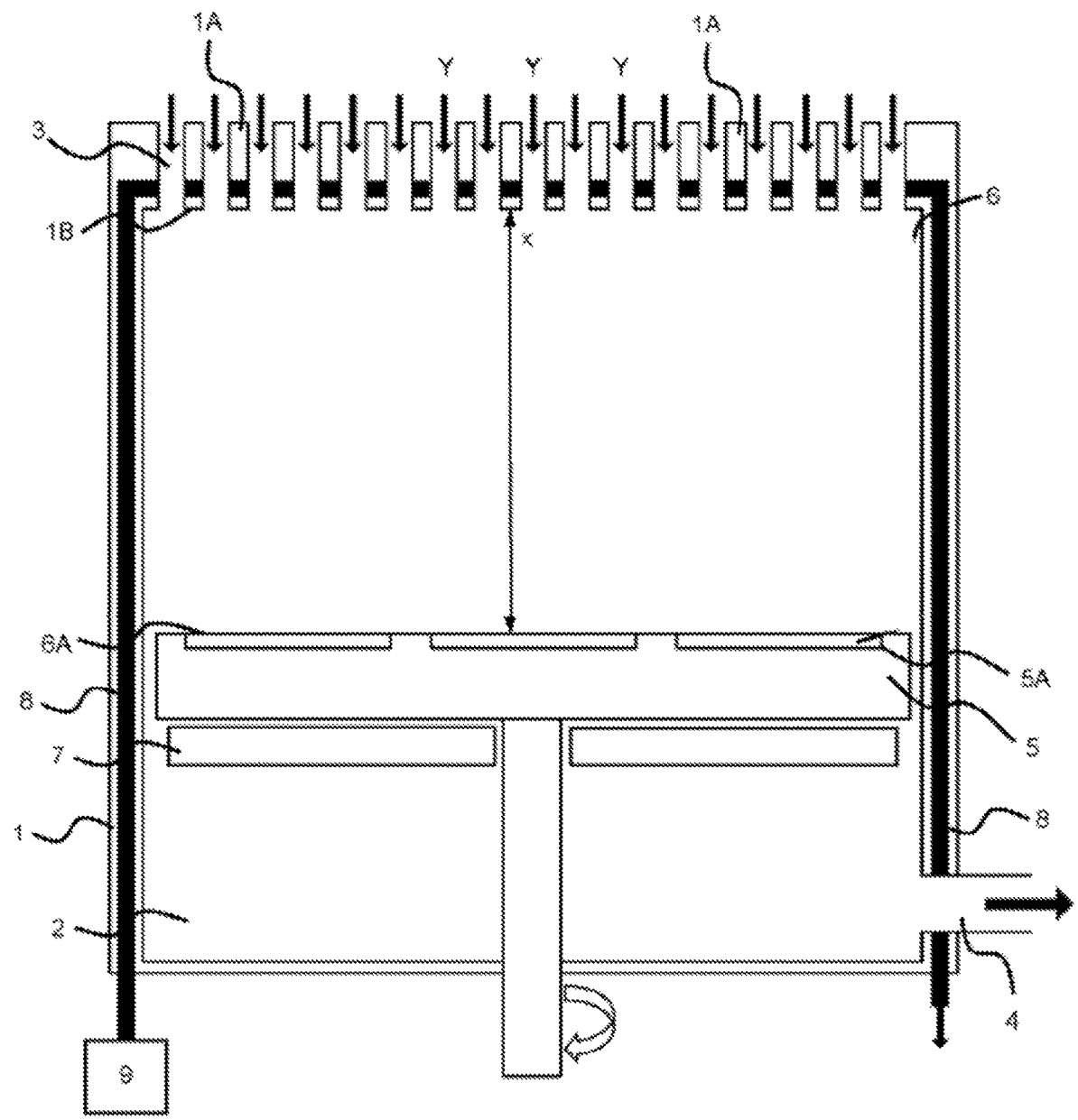

US 11,643,719 B2

METHOD OF MAKING GRAPHENE LAYER STRUCTURES

REFERENCE TO RELATED APPLICATION

This application is a U.S. national stage application based on PCT/GB2019/050062, filed Jan. 10, 2019, claiming priority to Great Britain application no. 1800451.5, filed Jan. 11, 2018, the entire disclosures of which are incorporated herein by reference.

FIELD OF THE INVENTION

The present invention relates to a method of making graphene layer structures suitable for use in, for example, electrical devices. In particular, the method of the invention provides an improved method for mass-producing high-purity graphene layer structures and permits the use of a broader range of precursor compounds.

BACKGROUND

Graphene is a well-known material with a plethora of proposed applications driven by the material's theoretical extraordinary properties. Good examples of such properties and applications are detailed in 'The Rise of Graphene' by A. K. Geim and K. S. Novoselev, Nature Materials, vol. 6, March 2007, 183-191.

WO 2017/029470, the content of which is incorporated herein by reference, discloses methods for producing two-dimensional materials. Specifically, WO 2017/029470 discloses a method of producing two-dimensional materials such as graphene, comprising heating a substrate held within a reaction chamber to a temperature that is within a decomposition range of a precursor, and that allows graphene formation from a species released from the decomposed precursor; establishing a steep temperature gradient (preferably >1000° C. per meter) that extends away from the substrate surface towards an inlet for the precursor; and introducing precursor through the relatively cool inlet and across the temperature gradient towards the substrate surface. The method of WO 2017/029470 may be performed using vapour phase epitaxy (VPE) systems and metal-organic chemical vapour deposition (MOCVD) reactors.

The method of WO 2017/029470 provides two-dimensional materials with a number of advantageous characteristics including: very good crystal quality; large material grain size; minimal material defects; large sheet size; and are self-supporting. However, there remains a need for fast and low-cost processing methods for fabricating devices from the two-dimensional materials.

WO 2017/029470 emphasises a need to have a small separation between the inlets and the substrate. This is to achieve a high temperature gradient for the decomposing precursor. While a separation of up to 100 mm is contemplated, 20 mm or less is much preferred. The substrate in this application may be rotated, but the design of reactor favours low rotation speeds below at most 200 rpm.

US 2017/0253967 relates to a chemical vapour deposition (CVD) reactor.

CN204151456 discloses a MOCVD reaction device for preparing an epitaxial wafer of a semiconductor.

EP1240366 and US2004/028810 disclose designs of chemical vapor deposition reactors.

SUMMARY OF THE INVENTION

It is an object of the present invention to provide an improved method for producing graphene layer structures which overcome, or substantially reduce, problems associated with the prior art or at least provide a commercially useful alternative thereto.

Accordingly, the present invention provides a method for the production of a graphene layer structure, the method comprising:
  providing a substrate on a heated susceptor in a reaction chamber, the chamber having a plurality of cooled inlets arranged so that, in use, the inlets are distributed across the substrate and have a constant separation from the substrate,
  rotating the heated susceptor at a rotation rate of at least 300 rpm, preferably 600 to 3000 rpm,
  supplying a flow comprising a precursor compound through the inlets and into the reaction chamber to thereby decompose the precursor compound and form graphene on the substrate,
  wherein the inlets are cooled to less than 100° C., preferably 50 to 60° C., and the susceptor is heated to a temperature of at least 50° C. in excess of a decomposition temperature of the precursor,
  wherein the constant separation is at least 12 cm and preferably from 12 to 20 cm.

BRIEF DESCRIPTION OF THE FIGURE

FIG. 1 shows a schematic cross-section of a graphene-layer growth chamber for use in the method described herein.

DETAILED DESCRIPTION OF PREFERRED EMBODIMENTS

The present disclosure will now be described further. In the following passages different aspects/embodiments of the disclosure are defined in more detail. Each aspect/embodiment so defined may be combined with any other aspect/embodiment or aspects/embodiments unless clearly indicated to the contrary. In particular, any feature indicated as being preferred or advantageous may be combined with any other feature or features indicated as being preferred or advantageous.

The present disclosure relates to a method for the production of a graphene layer structure, such as one having from 1 to 100 graphene layers, preferably 1 to 40 graphene layers, more preferably 1 to 10. The more layers present, the better the electrical properties observed. Graphene is a well-known term in the art and refers to an allotrope of carbon comprising a single layer of carbon atoms in a hexagonal lattice. The term graphene used herein encompasses structures comprising multiple graphene layers stacked on top of each other. The term graphene layer is used herein to refer to a graphene monolayer. Said graphene monolayers may be doped or undoped, but are generally undoped given the benefits of the method described herein. The graphene layer structures disclosed herein are distinct from graphite since the layer structures retain graphene-like properties.

The substrate of the present method may be any known MOCVD or VPE substrate. It is preferred that the substrate provides a crystalline surface upon which the graphene is produced as ordered crystal lattice sites provide a regular array of nucleation sites that promote the formation of good graphene crystal overgrowth. The most preferred substrates provide a high density of nucleation sites. The regular repeatable crystal lattice of substrates used for semiconductor deposition is ideal, the atomic stepped surface offering diffusion barriers. Preferably the substrate comprises sapphire or silicon carbide, preferably sapphire. Other suitable substrates may include silicon, diamond, nitride semiconductor materials (AlN, AlGaN, GaN, InGaN and complexes of), arsenide/phosphide semiconductors (GaAs, InP, AlInP and complexes of).

MOCVD is a term used to describe a system used for a particular method for the deposition of layers on a substrate. While the acronym stands for metal-organic chemical vapour deposition, MOCVD is a term in the art and would be understood to relate to the general process and the apparatus used therefor and would not necessarily be considered to be restricted to the use of metal-organic reactants or to the production of metal-organic materials. Instead, the use of this term indicates to the person skilled in the art a general set of process and apparatus features. MOCVD is further distinct from CVD techniques by virtue of the system complexity and accuracy. While CVD techniques allow reactions to be performed with straight-forward stoichiometry and structures, MOCVD allows the production of difficult stoichiometries and structures. An MOCVD system is distinct from a CVD system by virtue of at least the gas distribution systems, heating and temperature control systems and chemical control systems. An MOCVD system typically costs at least 10 times as much as a typical CVD system. CVD techniques cannot be used to achieve high quality graphene layer structures.

MOCVD can also be readily distinguished from atomic layer deposition (ALD) techniques. ALD relies on step-wise reactions of reagents with intervening flushing steps used to remove undesirable byproducts and/or excess reagents. It does not rely on decomposition or dissociation of the reagent in the gaseous phase. It is particularly unsuitable for the use of reagents with low vapour pressures such as silanes, which would take undue time to remove from the reaction chamber.

Generally it is preferred to have a substrate that is as thin as possible to ensure thermal uniformity across the substrate during graphene production. Preferred thicknesses are 50 to 300 microns, preferably 100 to 200 microns and more preferably about 150 microns. However, thicker substrates would also work and thick silicon wafers are up to 2 mm thick. The minimum thickness of the substrate is however determined in part by the substrate's mechanical properties and the maximum temperature at which the substrate is to be heated. The maximum area of the substrate is dictated by the size of the reaction chamber. Preferably the substrate has a diameter of at least 2 inches, preferably 2 to 24 inches and more preferably 6 to 12 inches. This substrate can be cut after growth to form individual devices using any known method.

The substrate is provided on a heated susceptor in a reaction chamber as described herein. Reactors suitable for use in the present method are well known and include heated susceptor capable of heating the substrate to the necessary temperatures. The susceptor may comprise a resistive heating element or other means for heating the substrate.

The chamber has a plurality of cooled inlets arranged so that, in use, the inlets are distributed across the substrate and have a constant separation from the substrate. The flow comprising a precursor compound may be provided as a horizontal laminar flow or may be provided substantially vertically. Inlets suitable for such reactors are well known.

The spacing between the substrate surface upon which the graphene is formed and the wall of the reactor directly above the substrate surface has a significant effect on the reactor thermal gradient. It has previously been considered that the thermal gradient should be as steep as possible which correlates to a preferred spacing that is as small as possible. However, the present inventors have now found that there are benefits associated with a higher spacing when coupled with a higher rotation rate. In particular, these two characteristics result in a vortex within the chamber. This increases the residency time of the precursor at the substrate surface and encourages graphene growth.

The susceptor is rotated to thereby rotate the substrate. The rotation rate is at least 300 rpm. Preferably the rotation rate is from 600 to 3000 rpm, preferably from 1000 to 1500 rpm. Without wishing to be bound by theory, it is considered that this rotation rate causes potential dopants to be expelled from the graphene growth region, perhaps by centripetal force. This means that the risk of any contaminants being included in the graphene as a dopant is significantly reduced.

Experimentation suggests a minimum spacing of about 12 cm is suitable. However, preferably the spacing is from 12 to 20 cm and preferably about 15 cm. This increased spacing helps to increase the residency time of the decomposing precursor compound which helps to form a satisfactory graphene layer structure.

During the production method, a flow is supplied comprising a precursor compound through the inlets and into the reaction chamber to thereby decompose the precursor compound and form graphene on the substrate. The flow comprising a precursor compound may further comprise a dilution gas. Suitable dilution gases are discussed in more detail below.

Advantageously, the use of such process conditions provides a much wider range of precursor compounds for the process. In particular, precursor compounds having a lower decomposition temperature can be employed, even if they would have been expected to give rise to undesirable impurities.

Preferably the precursor compound comprises, and preferably is, an organic compound comprising at least one heteroatom. By organic compound it is meant a chemical compound comprising carbon and typically having at least one covalent bond such as a C—H or C—C bond. By heteroatom it is meant an atom other than carbon or hydrogen. Preferably the heteroatom is a metal atom, or an N, S, P, Si or halogen. By way of example, a suitable organic compound is a metalorganic, such as trimethylindium, dimethylzinc, trimethylaluminum or trimethyl gallium, or $CH_2Br_2$. When using trimethyl gallium or $CH_2Br_2$ precursor compounds the inventors surprisingly found that neither the Ga nor the Br was incorporated into the graphene as a dopant.

Moreover, the process opens up the range of compounds which can be used. For example, whereas the process of WO 2017/029470 would not be compatible with compounds which contain OH groups, these can be used in the present invention because the detrimental oxygen atom will not be introduced into the structure. In addition, less pure materials can be used, including those which contain raised levels of $H_2O$ as a contaminant. This means that much cheaper precursors can be used.

Preferably the precursor compound is a liquid at room temperature. Where the compound is liquid at room temperature, they can generally be obtained in a highly pure liquid form at low cost. As will be appreciated, the optional presence of heteroatoms permits a broader range of compounds to be used having a high purity and low cost, without resulting in undesired doping.

The precursor is preferably in the gas phase when passed over the heated substrate. There are two further variables to be considered: pressure within the reaction chamber and the gas flow rate into the chamber.

The preferred pressure selected depends upon the precursor chosen. In general terms, where precursors of greater molecular complexity are used, improved two-dimensional crystalline material quality and rate of production is observed using lower pressures, e.g. less than 500 mbar. Theoretically, the lower the pressure the better, but the benefit provided by very low pressures (e.g. less than 200 mbar) will be offset by very slow graphene formation rates.

Conversely for less complex molecular precursors, higher pressures are preferred. For example where methane is used as a precursor for graphene production, a pressure of 600 mbar or greater may be suitable. Typically, it is not expected to use pressures greater than atmospheric because of its detrimental impact on substrate surface kinetics and the mechanical stresses placed on the system. A suitable pressure can be selected for any precursor through simple empirical experimentation, which may involve for example, five test runs using respective pressures of 50 mbar, 950 mbar and three others of equidistance intervals between the first two. Further runs to narrow the most suitable range can then be conducted at pressures within the interval identified in the first runs as being most suitable.

The precursor flow rate can be used to control the graphene deposition rate. The flow rate chosen will depend upon the amount of the species within the precursor and the area of the layer to be produced. Precursor gas flow rate needs to be high enough to allow coherent graphene layer formation on the substrate surface. If the flow is above an upper threshold rate, bulk material formation, e.g. graphite, will generally result or increased gas phase reactions will occur resulting in solid particulates suspended in the gas phase that are detrimental to graphene formation and/or may contaminate the graphene layer. The minimum threshold flow rate can be theoretically calculated using techniques known to the person skilled in the art, by assessing the amount of the species required to be supplied to the substrate to ensure sufficient atomic concentrations are available at the substrate surface for a layer to form. Between the minimum and upper threshold rates, for a given pressure and temperature, flow rate and graphene layer growth rate are generally linearly related.

Preferably a mixture of the precursor with a dilution gas is passed over the heated substrate within a reaction chamber. The use of a dilution gas allows further refinement of the control of the carbon supply rate.

It is preferred that the dilution gas includes one or more of hydrogen, nitrogen, argon and helium. These gases are selected because they will not readily react with a large number of available precursors under typical reactor conditions, nor be included in the graphene layer. Notwithstanding, hydrogen may react with certain precursors. While nitrogen can be incorporated into the graphene layer in the reactor of WO 2017/029470, this is less likely under the conditions described herein. In such instances one of the other dilution gases can be used.

Hydrogen and nitrogen are particularly preferred because they are standard gases used in MOCVD and VPE systems.

The susceptor is heated to a temperature of at least 50° C. in excess of a decomposition temperature of the precursor, more preferably from 100 to 200° C. in excess. The preferred temperature to which the substrate is heated is dependent upon the precursor selected. The temperature selected needs to be high enough to allow at least partial decomposition of the precursor in order to release the species, but preferably not so high as to promote increased recombination rates in the gas phase away from the substrate surface and hence production of unwanted by-products. The selected temperature is higher than the complete decomposition temperature to promote improved substrate surface kinetics and so encourage formation of graphene with good crystal quality. For hexane, the most preferred temperature is about 1200° C., such as from 1150 to 1250° C. It is desirable to use compounds with a lower decomposition temperature in order to reduce process costs.

In order for there to be a thermal gradient between the substrate surface and the introduction point for precursor, the inlet will need to be of a lower temperature than the substrate. For a fixed separation a greater temperature difference will provide a steeper temperature gradient. It is preferred that at least the wall of the chamber through which the precursor is introduced, and more preferably the walls of the chamber are cooled. Cooling may be achieved using a cooling system, for example, using fluid, preferably liquid, most preferably water, cooling. The reactor's walls may be maintained at constant temperature by water cooling. The cooling fluid may flow around the inlet(s) to ensure that the temperature of the inner surface of the reactor wall through which the inlets extend, and thus of the precursor itself as it passes through the inlet and into the reaction chamber, is substantially lower than the substrate temperature. The inlets are cooled to less than 100° C., preferably 50 to 60° C.

The method optionally further comprises a step of using a laser to selectively ablate graphene from the substrate. Suitable lasers are those having wavelength in excess of 600 nm and a power of less than 50 Watts. Preferably the laser has a wavelength of from 700 to 1500 nm. Preferably the laser has a power of from 1 to 20 Watts. This allows the graphene to be readily removed without damaging the neighbouring graphene or the substrate.

Preferably the laser spot size is kept as small as possible (i.e. have a better resolution). For example, the present inventors have worked at a spot size of 25 microns. Focus should be as precise as possible. It has also been found that it is better to pulse the laser as opposed to continuous lasing, in order to prevent substrate damage.

Elements of the above-described method will now be discussed in more detail.

The present invention involves the use of different design of MOCVD reactor. An example of this is contemplated which has been demonstrated to be efficient for graphene growth as described herein. This design is a so-called High Rotation Rate (HRR) or "Vortex" flow system. Whereas the close-coupled reactor described in WO 2017/029470 focussed on creating graphene using a very high thermal gradient, the new reactor has a significantly wider spacing between the injection point and growth surface or substrate. Close coupling allowed extremely rapid dissociation of precursors delivering elemental carbon, and potentially other doping elements, to the substrate surface allowing the formation of graphene layers. In contrast, the new design relies on a vortex of the precursors.

In the new reactor design, in order to promote laminar flow over the surface this system utilizes a higher rotation rate to impinge a high level of centrifugal acceleration on the injected gas stream. This results in a vortex type fluid flow within the chamber. The effect of this flow pattern is a significantly higher residency time of the precursor molecules proximate to the growth/substrate surface compared to other reactor types. For the deposition of graphene this increased time is what promotes the formation of elemental layers.

However, this type of reactor does have a couple of parasitic issues, firstly the amount of precursor required to achieve the same amount of growth as other reactors increases due to the reduced mean free path that this flow regime causes, resulting in more collisions of precursor molecules delivering non-graphene growth atomic recombination. However, the use of reagents which are relatively cheap means that this problem can be readily overcome. Additionally, the centrifugal motion has varying impacts on atoms and molecules of different sizes resulting in the ejection of different elements at different velocities. While this assists graphene growth due to the uniform rate of carbon supply with ejection of unwanted precursor by-products it can be detrimental to desired effects such as elemental doping. It is therefore preferred to use this design of reactor for undoped graphene, such as is desirably used for hall sensors or filters and can achieve reduced impurity levels.

Substantially central to the array of cooled inlets, there may be a secondary inlet, a so-called optical purge inlet. This inlet can be provided with a higher gas flow rate of the gases introduced into the reaction chamber compared to each of the other individual inlets. This serves to promote laminar flow despite the high rotation speeds.

An example of such a reaction system is the Veeco Instruments Inc. Turbodisc technology, K455i or Propel tools.

The reactor of FIG. 1 is constructed for the deposition of a graphene layer on a substrate through the method of Vapour Phase Epitaxy (VPE), in which a precursor is introduced to thermally, chemically and physically interact in the vicinity of and on the substrate to form a graphene layer structure having from 1 to 40, preferably 1 to 10 graphene layers.

The apparatus comprises a close coupled reactor 1 having a chamber 2 having an inlet or inlets 3 provided through a wall 1A and at least one exhaust 4. A susceptor 5 is arranged to reside within the chamber 2. The susceptor 5 comprises one or more recesses 5A for retaining one or more substrates 6. The apparatus further comprises means to rotate the susceptor 5 within the chamber 2; and a heater 7, e.g. comprising a resistive heating element, or RF induction coil, coupled to the susceptor 5 to heat the substrate 6. The heater 7 may comprise a single or multiple elements as required to achieve good thermal uniformity of the substrate 6. One or more sensors (not shown) within the chamber 2 are used, in conjunction with a controller (not shown) to control the temperature of the substrate 6.

The temperature of the walls of the reactor 1 is maintained at substantially constant temperature by water cooling.

The reactor walls define one or more internal channels and/or a plenum 8 that extend substantially adjacent (typically a couple of millimetres away) the inner surface of reactor walls including inner surface 1B of wall 1A. During operation, water is pumped by a pump 9 through the channels/plenum 8 to maintain the inside surface 1B of wall 1A at or below 200° C. In part because of the relatively narrow diameter of the inlets 3, the temperature of the precursor (which is typically stored at a temperature much below the temperature of inside surface 1B), as it passes through inlets 3 through wall 1A into the chamber 1 will be substantially the same or lower than the temperature of the inside surface 1B of wall 1A.

The inlets 3 are arranged in an array over an area that is substantially equal or greater than the area of the one or more substrates 6 to provide substantially uniform volumetric flow over substantially the entirety of surfaces 6A of the one or more substrates 6 that face the inlets 3.

The pressure within the chamber 2 is controlled through control of precursor gas flows through inlet(s) 3 and exhaust gas through exhaust 4. Via this methodology, the velocity of the gas in the chamber 2 and across the substrate surface 6A and further the mean free path of molecules from the inlet 3 to substrate surface 6A are controlled. Where a dilution gas is used, control of this may also be used to control pressure through inlet(s) 3.

The susceptor 5 is comprised from a material resistant to the temperatures required for deposition, the precursors and dilution gases. The susceptor 5 is usually constructed of uniformly thermally conducting materials ensuring substrates 6 are heated uniformly. Examples of suitable susceptor material include graphite, silicon carbide or a combination of the two.

The substrate(s) 6 are supported by the susceptor 5 within the chamber 2 such that they face wall 1A with a separation, denoted in FIG. 1 by X, of between 12 cm-20 cm. Where the inlets 3 protrude into or otherwise sit within the chamber 2, the relevant separation is measured between the substrate(s) 6 and exit of the inlets 3.

The spacing between the substrate 6 and the inlets 3 may be varied by moving the susceptor 5, substrate 6 & heater 7.

The susceptor 5 is rotated at a rotation rate of at least 300 rpm and preferably up to 3000 rpm, such as preferably 1000 to 1500 rpm.

Precursors in gaseous form or in molecular form suspended in a gas stream are introduced (represented by arrows Y) into the chamber 2 through inlets 3 such that they will impinge on or flow over the substrate surface 6A. Precursors that may react with one another are kept separated until entering the chamber 2 by introduction through different inlets 3. The precursor or gas flux/flow rate is controlled externally to the chamber 2 via a flow controller (not shown), such as a gas mass flow controller.

A dilution gas may be introduced through an inlet or inlets 3 to modify gas dynamics, molecular concentration and flow velocity in the chamber 2. The dilution gas is usually selected with respect to the process or substrate 6 material such that it will not have an impact on the growth process of the graphene layer structure. Common dilution gases include Nitrogen, Hydrogen, Argon and to a lesser extent Helium.

After the graphene layer structure having from 1 to 40, preferably 1 to 10 graphene layers has been formed, the reactor is then allowed to cool and the substrate 6 is retrieved having the graphene layer structure thereon. The substrate 6 may then be registered within a laser ablation rig comprising a HeNe laser having a wavelength of 1152 nm and a strength of 10 W. The laser rig was then used to define a circuit having graphene contacts on the substrate.

EXAMPLES

The present invention will now be described further with reference to the following non-limiting examples.

A dibromomethane precursor was admitted into a reaction chamber flowing at a flow of 370 sccm when the container storing the chemical itself is at 32° C. and 700 Torr. This continued for 11 minutes and 20 seconds when the reactor was at 1025° C. and 140 Torr until the layer is grown. In this case, the rotation rate was 710 RPM.

The main reactor flows are nitrogen and there is 50000 sccm flowing to the main reactor inlet (distributed between the plurality of cooled inlets) and 4700 sccm flowing to the optical purge outlet to the reactor. This optical purge line is usually at the very centre of the reactor and is used to stop deposition from condensing on the optical ports used to measure temperature, etc. of the reactor. However, this purge line is offset slightly in the preferred reactor design to help to prevent a dead volume from occurring at the very centre of the susceptor when at high rotation rates.

A trimethyl gallium precursor was admitted into a reaction chamber flowing at a flow of 55 sccm when the container storing the chemical itself is at 30° C. and 900 Torr. This continued for 7 minutes when the reactor was at 1150° C. and 75 Torr until the layer is grown. In this case, the rotation rate was 850 RPM.

The main reactor flows are nitrogen and there is 45000 sccm flowing to the main reactor inlet and 4100 sccm flowing to the optical purge outlet to the reactor.

All percentages herein are by weight unless otherwise stated.

The foregoing detailed description has been provided by way of explanation and illustration, and is not intended to limit the scope of the appended claims. Many variations in the presently preferred embodiments illustrated herein will be apparent to one of ordinary skill in the art, and remain within the scope of the appended claims and their equivalents.

The invention claimed is:

1. A method for the production of a graphene layer structure, the method comprising:
   providing a substrate on a heated susceptor in a reaction chamber, the chamber having a plurality of cooled inlets arranged so that, in use, the inlets are distributed across the substrate and have a constant separation from the substrate,
   rotating the heated susceptor at a rotation rate of at least 300 rpm, and
   supplying a flow comprising a precursor compound through the inlets and into the reaction chamber to thereby decompose the precursor compound and form graphene on the substrate,
   wherein the inlets are cooled to less than 100° C., and the susceptor is heated to a temperature of at least 50° C. in excess of a decomposition temperature of the precursor,
   wherein the constant separation is at least 12 cm; and
   wherein the graphene layer structure is undoped.

2. The method according to claim 1, wherein the graphene layer structure has from 1 to 100 graphene layers.

3. The method according to claim 2, wherein the rotation rate is from 1000 to 1500 rpm.

4. The method according to claim 2, wherein the constant separation is about 15 cm.

5. The method according to claim 2,
   wherein the rotation rate is from 1000 to 1500 rpm, and
   wherein the substrate comprises sapphire and has a diameter between 6 and 12 inches.

6. The method according to claim 5, wherein the constant separation is about 15 cm.

7. The method according to claim 1, wherein the rotation rate is from 600 to 3000 rpm.

8. The method according to claim 1, wherein the constant separation is about 15 cm.

9. The method according to claim 1, wherein the substrate is sapphire or silicon carbide.

10. The method according to claim 1, wherein the precursor compound comprises an organic compound comprising at least one heteroatom.

11. The method according to claim 10, wherein the heteroatom is a metal atom, or an N, S, P, Si or halogen.

12. The method according to claim 11, wherein the organic compound is a metalorganic, or $CH_2Br_2$.

13. The method according to claim 12, wherein the organic compound is a metalorganic selected from trimethylindium, dimethylzinc, trimethylaluminum or triethylgallium.

14. The method according to claim 1, wherein the substrate has a diameter of at least 2 inches.

15. The method according to claim 1, wherein the rotation rate is from 1000 to 1500 rpm.

16. The method according to claim 1, wherein the substrate is silicon.

17. The method according to claim 1, wherein the substrate is diamond.

18. The method according to claim 1, wherein the substrate is a nitride, arsenide or phosphide semiconductor material.

19. The method according to claim 18, wherein the substrate is selected from the group consisting of AlN, AlGaN, GaN, InGaN, GaAs, InP, AlInP, and complexes thereof.

20. A method for the production of a graphene layer structure, the method comprising:
   providing a substrate on a heated susceptor in a reaction chamber, the chamber having a plurality of cooled inlets arranged so that, in use, the inlets are distributed across the substrate and have a constant separation from the substrate,
   rotating the heated susceptor at a rotation rate of at least 300 rpm, and
   supplying a flow comprising a precursor compound through the inlets and into the reaction chamber to thereby decompose the precursor compound and form graphene on the substrate,
   wherein the inlets are cooled to less than 100° C., and the susceptor is heated to a temperature of at least 50° C. in excess of a decomposition temperature of the precursor,
   wherein the constant separation is at least 12 cm; and
   wherein the precursor compound comprises an organic compound that is a metalorganic selected from trimethylindium, dimethylzinc, trimethylaluminum or triethylgallium.

* * * * *